(12) United States Patent
Takamori

(10) Patent No.: US 6,319,317 B1
(45) Date of Patent: Nov. 20, 2001

(54) COATING FILM FORMING METHOD AND COATING APPARATUS

(75) Inventor: Hideyuki Takamori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/551,876

(22) Filed: Apr. 18, 2000

(30) Foreign Application Priority Data

Apr. 19, 1999 (JP) .................................................. 11-110372

(51) Int. Cl.$^7$ ........................... B05C 13/02; B05C 11/02; B05D 5/00; H01L 21/00; H01L 21/208

(52) U.S. Cl. .................... 118/52; 118/56; 118/665; 118/690; 118/713; 118/321; 427/240; 427/96; 427/10; 427/385.5; 438/758; 438/780; 430/935

(58) Field of Search ..................................... 118/665, 668, 118/690, 691, 712, 713, 52, 56, 313, 320, 321, 300; 427/240, 96, 8, 9, 10, 425, 385.5, 231; 438/758, 760, 780, 782; 430/935

(56) References Cited

U.S. PATENT DOCUMENTS

| | | | |
|---|---|---|---|
| 4,910,549 | * 3/1990 | Sugita | 355/53 |
| 5,658,615 | 8/1997 | Hasebe et al. | 427/240 |
| 5,695,817 | 12/1997 | Tateyama et al. | 427/240 |
| 5,843,527 | * 12/1998 | Sanada | 427/240 |
| 5,985,357 | * 11/1999 | Sanada | 427/8 |
| 5,989,632 | * 11/1999 | Sanada et al. | 427/240 |

FOREIGN PATENT DOCUMENTS

| | | | |
|---|---|---|---|
| 09260277-A | * 10/1997 | (JP) | H01L/21/027 |
| 10-043666 | 2/1998 | (JP) . | |

* cited by examiner

Primary Examiner—Richard Crispino
Assistant Examiner—J. A. Lorengo
(74) Attorney, Agent, or Firm—Rader Fishman Grauer PLLC

(57) ABSTRACT

A spreading state of an outline of the outer periphery of a coating solution is detected by a detecting sensor, and the rotation speed or the like of a wafer as a substrate is controlled so that a spreading speed of the outline becomes not more than a predetermined speed with no danger of producing a scratchpad. Alternatively, the width in the radius direction of a scratchpad is measured, and the rotation speed or the like of the wafer is controlled so that the width in the radius direction becomes not more than a predetermined value. Thereby, occurrence of the scratchpad is prevented or the degree thereof is decreased, thereby avoiding uncoating of the coating solution on the substrate and reducing the amount of the coating solution used.

12 Claims, 7 Drawing Sheets

COATING FILM FORMING METHOD AND COATING APPARATUS

BACKGROUND OF THE INVENTION

1. Field of the Invention

The present invention relates to a coating film forming method and a coating apparatus each for forming a coating film, for example, a resist film on the front face of a substrate such as a semiconductor wafer or the like.

2. Description of the Related Art

For instance, in a photolithography process of a semiconductor device, a photoresist is applied to a semiconductor wafer, a circuit pattern is transferred to the photoresist using photolithography technology, and the circuit pattern is developed, thereby forming a circuit. In the above process, included is a coating film forming process for applying a resist solution onto the front face of the semiconductor wafer.

In the forming method of a resist film in this case, as shown in FIG. 13, the semiconductor wafer W is mounted on a spin chuck (illustration thereof is omitted) in a processing case and the wafer W is rotated by a drive motor 201. Then, the resist solution is dripped from a resist solution supply nozzle 203 onto the center of the wafer W by a pump 202 such as a bellows pump or the like. Thereby, as shown by many arrows in FIG. 13, the resist solution R is diffused from the center of the wafer W toward the surrounding portion by centrifugal force. Thereafter, the rotation of the wafer W is kept to adjust the thickness of the resist solution R diffused on the wafer W to form a resist film with a uniform film thickness on the wafer W and to blow off an excess resist solution.

As shown by many arrows in FIG. 13, when the resist solution R diffuses from the center of the wafer W toward the surrounding portion by centrifugal force, the circular outline of the outer periphery of the resist solution R spreads while the diameter thereof is increasing by centrifugal force and finally reaches the outer edge of the wafer W keeping its circular form. Thereby, the resist solution R is applied on the entire face of the wafer W in a uniform thickness.

However, when the resist solution R diffuses from the center of the wafer W toward the surrounding portion, as shown in FIG. 14, as for the outline in circular form of the resist solution R, it occurs that the circular form can not be kept and portions thereof which break the circular outline to protrude outward appear in various positions resulting in a waveform outline. This outline in waveform is called "scratchpad", which means that the resist solution R can not spread uniformly on the wafer W. If its degree is serious, "uncoating" of the resist solution occurs and thus there is a danger that a resist film can not be formed on the entire surface of the wafer W uniformly in film thickness.

As the reason why the scratchpad S occurs, it is suspected that centrifugal force acts greatly with the circular outline of the resist solution R spreading outward, thereby increasing the spreading speed of the outline, and as a result, portions breaking the circular outline appear in various positions.

By the way, in recent years, the amount of the resist solution dripped is reduced from the viewpoint of reducing the amount of the resist consumed because of a reduction in fabrication cost and the like. Therefore, a solvent such as a thinner or the like is applied before applying the resist solution to improve wettability of the resist solution, thereby preventing a scratchpad. However, when the amount of the resist is little, a scratchpad is prone to occur, and also when the wettability is poor, a scratchpad is easily to occur.

To avoid "uncoating" by preventing this kind of scratchpad, conventionally it is necessary to apply a resist solution in amount slightly more excessive than originally needed, on the contrary to the demand to reduce as much as possible the consumption of resist in the result.

SUMMARY OF THE INVENTION

An object of the present invention is to provide a coating film forming method and a forming apparatus each for preventing occurrence of a scratchpad or decreasing the degree thereof to thereby avoid uncoating of the coating solution on a substrate and for reducing the amount of the coating solution used.

To solve the above disadvantage, according to a fist aspect of the present invention, a coating film forming method for supplying a coating solution from a coating solution supply nozzle onto the front face of a substrate housed in a processing case to form a coating film comprises the steps of: mounting the substrate on a mounting table and rotating the substrate; discharging the coating solution from the coating solution supply nozzle onto almost the center of the substrate and diffusing the coating solution from almost the center of the rotated substrate toward the outer edge; detecting a spreading state of an outline of the outer periphery of the diffusing coating solution; and controlling at least one of the rotation speed of the substrate, the amount of the coating solution discharged from the coating solution supply nozzle, and the speed of the coating solution discharged from the coating solution supply nozzle based on the detected state.

According to a second aspect of the present invention, a coating apparatus comprises: means for rotating a substrate; means for discharging a coating solution onto almost the center of the rotated substrate; detecting means for detecting a spreading state of an outline of the outer periphery of the coating solution when the discharged solution is diffused from almost the center of the rotated substrate toward the outer edge; and means for controlling at least one of the rotation speed of the substrate, the amount of coating solution discharged, and the speed of the coating solution discharged based on the detected state.

In the study results of the inventor, it has been found that a scratchpad greatly depends on the spreading speed of the coating solution, that is, a scratchpad occurs when the spreading speed of the coating solution becomes not less than a predetermined speed with an increase in centrifugal force, and thus a scratchpad can be prevented by properly controlling the spreading speed of the coating solution, and that even if a scratchpad occurs, the scratchpad up to a certain degree does not become a cause of uncoating.

Therefore, in the aforesaid present invention, for instance, the spreading state of the outline of the outer periphery of the coating solution diffusing from almost the center of the rotated substrate toward the outer edge is detected, the spreading speed is calculated from the spreading state, and the rotation speed of the substrate and/or the amount or the speed of the coating solution discharged from the coating solution supply nozzle are/is controlled so that the spreading speed becomes not more than a predetermined speed, thereby preventing a scratchpad. Consequently, uncoating on the substrate can be prevented and the coating solution can be applied uniformly in film thickness. Therefore, it is unnecessary to supply an excessive coating solution unlike the prior art, and the amount of the coating solution used can be reduced further. Moreover, the control as above can prevent occurrence of a scratchpad even if wettability of the solvent applied before the coating solution is poor, thereby preventing occurrence of uncoating of the coating solution.

Further, in the aforesaid present invention, for instance, the spreading state of the outline of the outer periphery of the coating solution diffusing from almost the center of the rotated substrate toward the outer edge is detected, the spreading state of the outline of the outer periphery of the coating solution is detected when the coating solution is diffused from almost the center of the rotated substrate toward the outer edge, and when a scratchpad formed by breaking the outline of the outer periphery of the coating solution is detected, the width in the radius direction of the scratchpad is kept, and the rotation speed of the substrate and/or the amount or the speed of the coating solution discharged from the coating solution supply nozzle are/is controlled so that the above width becomes not more than a predetermined value. Thereby, the scratchpad can be prevented from becoming so large as to exert influence upon application of the resist solution, so that uncoating on the substrate can be prevented and the coating solution can be applied uniformly in film thickness. Consequently, similarly in this case, it is unnecessary to supply an excessive coating solution unlike the prior art, the amount of the coating solution used can be reduced further, and even if wettability of the solvent applied before the coating solution is poor, occurrence of uncoating of the coating solution can be prevented by the above control.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, embodiments of the present invention will be described in detail with reference to the accompanying drawings.

Figure 1:
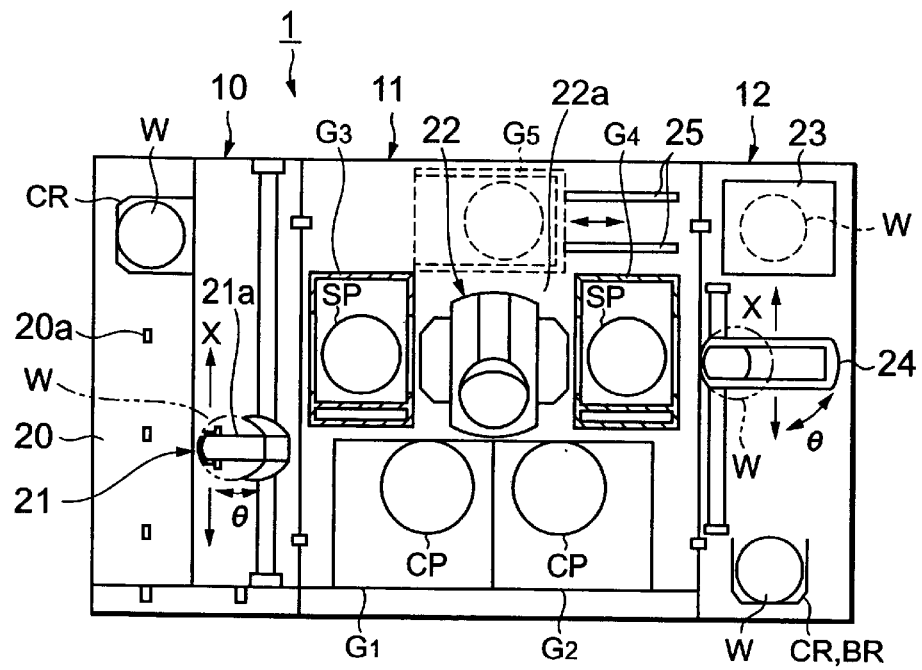
FIG. 1 is a plane view showing the whole structure of a resist coating and developing processing system for a semiconductor wafer to which an embodiment of the present invention is applied.
Figure 2:
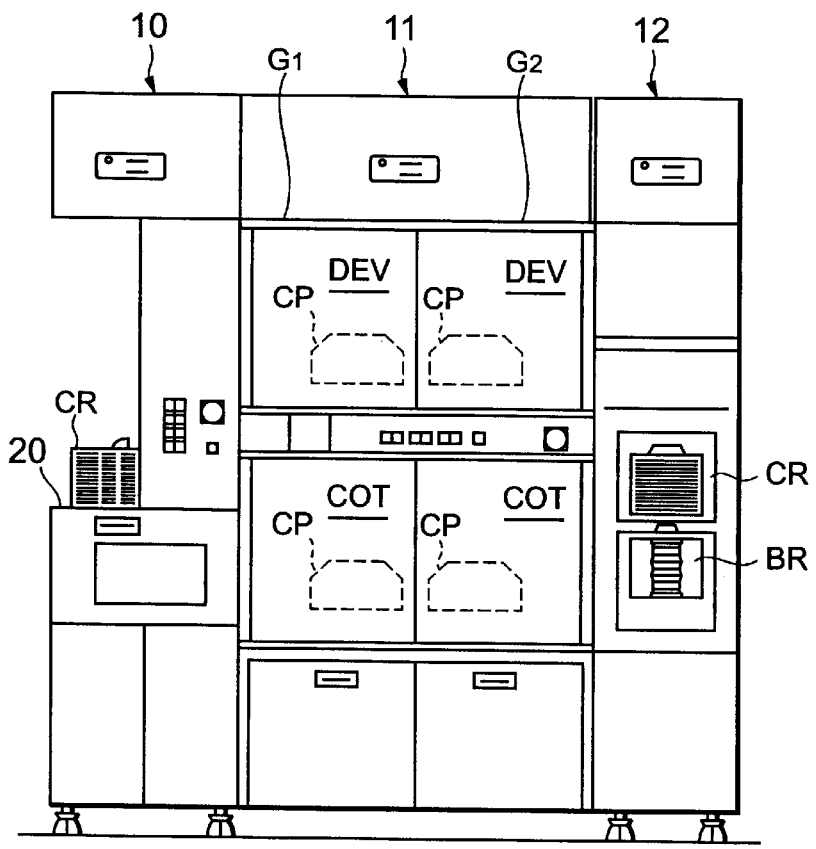
FIG. 2 is a front view showing the coating and developing processing system shown in FIG. 1.
Figure 3:
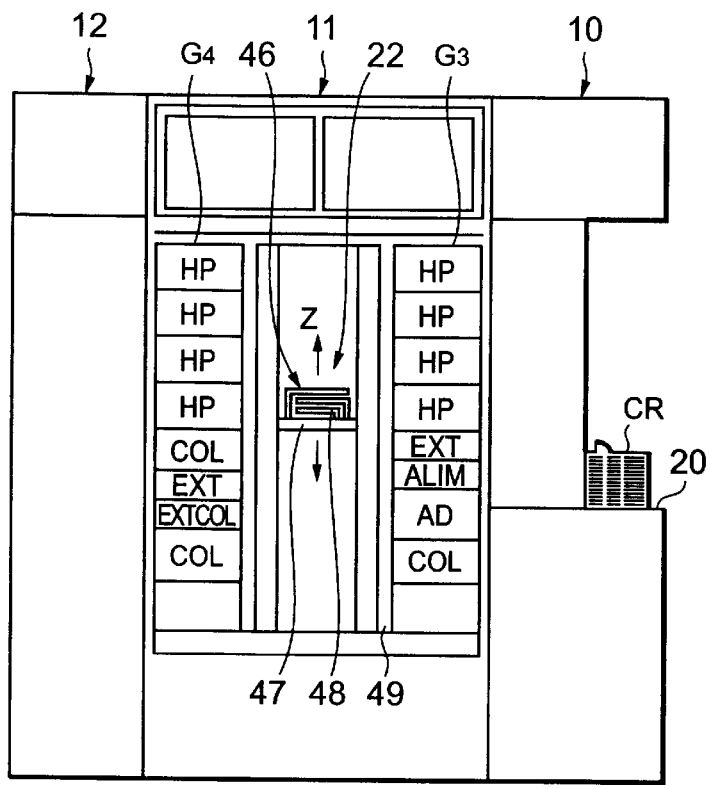
FIG. 3 is a rear view showing the coating and developing processing system shown in FIG. 1.

FIG. 1 is a schematic plane view showing a resist coating and developing processing system used for embodiments of the present invention, FIG. 2 is a front view thereof, and FIG. 3 is a rear view thereof.

This processing system comprises a cassette station 10 as a transfer station, a processing station 11 having a plurality of processing units, and an interface section 12 for transferring a wafer W between the processing station 11 and an aligner (not shown) provided adjacent thereto.

The above cassette station 10 is provided for carrying a plurality of, for example, 25 semiconductor wafers w (hereinafter referred to only as wafers) as objects to be processed, as a unit, housed in a wafer cassette CR, into this system from another system or from this system into another system, and transferring the wafer W between the wafer cassette CR and the processing station 11.

In this cassette station 10, as shown in FIG. 1, a plurality of (four in FIG. 1) positioning projections 20a are formed along an X-direction in FIG. 1 on a wafer cassette mounting table 20, and the wafer cassettes CR can be mounted in a line with respective wafer transfer ports facing the processing station 11 side at the positions of the projections 20a. In the wafer cassette CR, the wafers W are arranged in a vertical direction (a Z-direction). The cassette station 10 has a wafer transfer mechanism 21 disposed between the wafer cassette mounting table 20 and the processing station 11. The wafer transfer mechanism 21 has a wafer transfer arm 21a movable in the direction of arrangement of the cassettes (the X-direction) and in the direction of arrangement of the wafers W housed therein (the Z-direction) and can selectively get access to any of the wafer cassettes CR by the transfer arm 21a. The wafer transfer arm 21a is structured to be rotatable in a θ-direction so that it is accessible to an alignment unit (ALIM) and an extension unit (EXT) which are included in a third processing section $G_3$ on the processing station 11 side which will be described later.

The processing station 11 includes a plurality of processing units for carrying out a series of processes when coating and development are performed for the wafer W. These units are multi-tiered at predetermined positions, and the wafers W are processed one by one by these units. As shown in FIG. 1, the processing station 11 has a transfer path 22a in the middle thereof in which a main wafer transfer mechanism 22 is provided, and all the processing units are arranged around the wafer transfer path 22a. The plurality of processing units are divided into a plurality of processing sections, and a plurality of processing units are multi-tiered along the vertical direction in each processing section.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 can rotate by rotational driving force of a motor (not shown), and also the wafer transfer device 46 can be integrally rotated with the cylindrical supporter 49.

The wafer transfer device 46 includes a plurality of holding members 48 which are movable in a forward and rearward direction of a transfer base 47. The use of the holding members 48 realizes delivery of the wafer W between the processing units.

As shown in FIG. 1, four processing sections $G_1$, $G_2$, $G_3$, and $G_4$ are actually arranged around the wafer transfer path 22a in this embodiment and a processing section $G_5$ can be disposed as required.

Out of these, the first and second processing sections $G_1$ and $G_2$ are arranged in a raw on the front side of the system (on the lower side in FIG. 1), the third processing section $G_3$ is arranged adjacent to the cassette station 10, and the fourth processing section $G_4$ is arranged adjacent to the interface section 12. Moreover, the fifth processing section $G_5$ can be arranged on the rear side.

In the above case, as shown in FIG. 2, in the first processing section $G_1$, two spinner-type processing units in which the wafer W is mounted on a spin chuck (not illustrated) inside a cup CP to undergo predetermined processing are vertically two-tiered. In this embodiment, a resist coating unit (COT) for applying a resist onto the wafer W and a developing unit (DEV) for developing a pattern of the resist are two-tiered from the bottom in order. Similarly in the second processing section $G_2$, a resist coating unit (COT) and a developing unit (DEV) as two spinner-type processing units are two-tiered from the bottom in order.

The reason why the resist coating unit (COT) and the like are disposed on the lower tier side is that drainage of a resist solution is essentially more complex in terms of both mechanism and maintenance than that of a developing solution, and that the complexity is mitigated by disposing the resist coating unit (COT) and the like on the lower tier as described above. It is possible, however, to arrange the resist coating unit (COT) and the like on the upper tier as required.

As shown in FIG. 3, in the third processing section $G_3$, oven-type processing units in each of which the wafer W is placed on a mounting table SP to undergo predetermined processing are multi-tiered. More specifically, a cooling unit (COL) for performing cooling processing, an adhesion unit (AD) for performing so-called hydrophobic processing to enhance fixedness of the resist, an alignment unit (ALIM) for performing alignment, an extension unit (EXT) for carrying the wafer W in and out, and four hot plate units (HP) for performing heat processing for the wafer W before and after exposure processing and after developing processing are eight-tiered from the bottom in order. It is suitable to provide a cooling unit (COL) in place of the alignment unit (ALIM) and the cooling unit (COL) is given an alignment function.

In the fourth processing section $G_4$, oven-type processing units are multi-tiered. More specifically, a cooling unit (COL), an extension and cooling unit (EXTCOL) which is a wafer transfer section provided with a cooling plate, an extension unit (EXT), a cooling unit (COL), and four hot plate units (HP) are eight-tiered from the bottom in order.

The above arrangement of the cooling unit (COL) and the extension and cooling unit (EXTCOL) having low processing temperature at the lower tiers and the hot plate units (HP) having high processing temperature at the upper tiers, can reduce thermal mutual interference between units. Random multi-tiered arrangement is naturally suitable.

As described above, the fifth processing section $G_5$ can be provided on the rear side of the main wafer transfer mechanism 22. In the case where the fifth processing section $G_5$ is provided, it can be moved along guide rails 25 laterally as seen from the main wafer transfer mechanism 22. Accordingly, even in the case where the fifth processing section $G_5$ is provided, a space portion is obtained by sliding the fifth processing section $G_5$ along the guide rails 25, so that maintenance operation for the main wafer transfer mechanism 22 can be easily performed from the back thereof. For the operation, a space can be similarly secured not only by moving the fifth processing section $G_5$ linearly, but also by turning it. Incidentally, one processing section having a structure basically the same as the third and fourth processing sections $G_3$ and $G_4$ in which oven-type processing units are multi-tiered can be used as the fifth processing section $G_5$.

The interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, a peripheral aligner 23 is disposed at the rear, and a wafer transfer body 24 is disposed at the center. The wafer transfer body 24 moves in the X-direction and the Z-direction to be accessible to both the cassettes CR and BR, and the peripheral aligner 23. Moreover, the wafer transfer body 24 is rotatable in the θ-direction to be accessible to the extension unit (EXT) included in the fourth processing section $G_4$ of the processing station 11 and also to a wafer delivery table (not shown) on the adjacent aligner side.

In the resist coating and developing processing system, the wafer transfer arm 21a of the wafer transfer mechanism 21 first gets access to the wafer cassette CR housing unprocessed wafers W on the cassette mounting table 20 in the cassette station 10, and takes one wafer W out of the cassette CR and transfers the wafer W to the extension unit (EXT) included in the third processing section $G_3$.

The wafer W is transferred from the extension unit (EXT) to the processing station 11 by means of the wafer transfer device 46 of the main wafer transfer mechanism 22. Then, the wafer W undergoes alignment in the alignment unit (ALIM) included in the third processing section $G_3$ and thereafter is transferred to the adhesion unit (AD) to undergo hydrophobic processing (HMDS processing) for enhancing fixedness of the resist there. Since this processing is attended with heating, the wafer W is then transferred to the cooling unit (COL) by the wafer transfer device 46 and cooled.

The wafer W which is cooled in the cooling unit (COL) after the completion of the adhesion processing is sequentially transferred to the resist coating unit (COT) by the wafer transfer device 46, where a coating film is formed. After the completion of the coating processing, the wafer W undergoes prebake processing in any one of the hot plate units (HP) of the processing sections $G_3$ and $G_4$ and is cooled in any one of the cooling units (COL).

The cooled wafer w is transferred to the alignment unit (ALIM) of the third processing section $G_3$ and aligned there, and thereafter the wafer W is transferred to the interface section 12 via the extension unit (EXT) of the fourth processing section $G_4$.

In the interface section 12, peripheral exposure by the peripheral aligner 23 is performed to remove an excess resist, and the resist film of the wafer W undergoes exposure processing by the aligner (not shown) provided adjacent to the interface section 12 in accordance with a predetermined pattern.

The wafer W after exposure is returned to the interface section 12 and transferred to the extension unit (EXT)

included in the fourth processing section $G_4$ by the wafer transfer body 24. The wafer W is transferred to any one of the hot plate units (HP) by the wafer transfer body 46 to undergo post-exposure bake processing and then cooled by the cooling unit (COL).

Then, the wafer W is transferred to the developing unit (DEV), where development of the exposure pattern is performed. After the completion of the development, the wafer W is transferred to any one of the hot plate units (HP) to undergo postbake processing and then it is cooled by the cooling unit (COL). After the completion of such a series of processing, the wafer W is returned to the cassette station 10 via the extension unit (EXT) of the third processing unit group $G_3$ and housed in any of the wafer cassettes CR.

Figure 4:
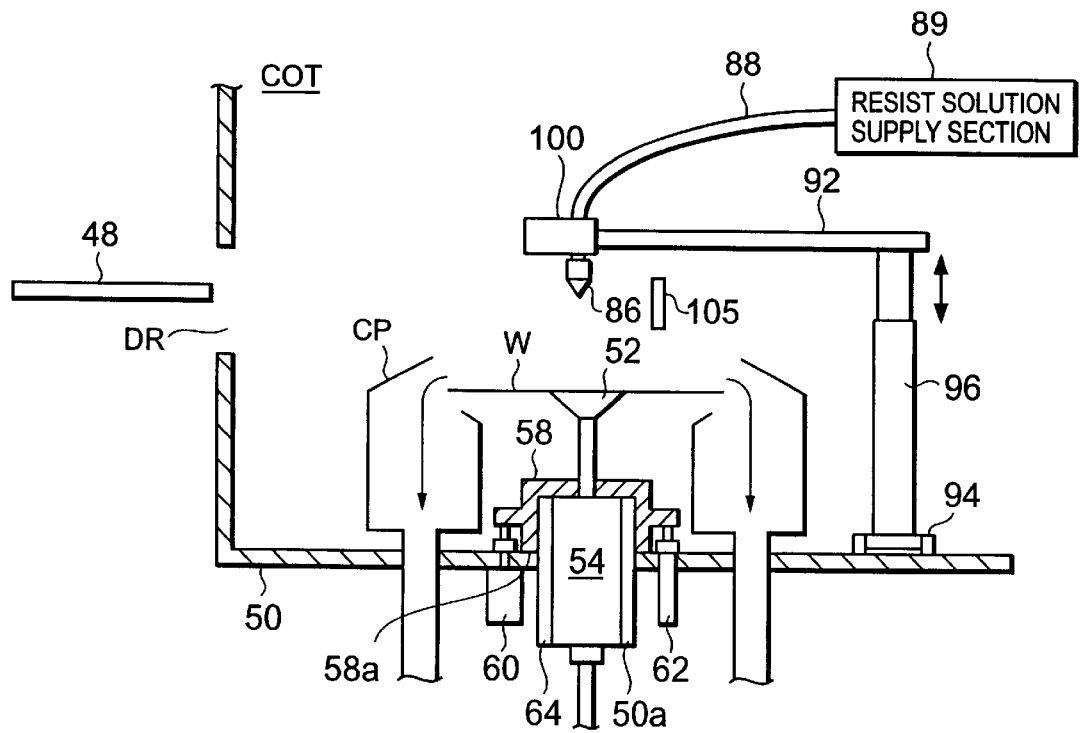
FIG. 4 is a sectional view of the whole structure of a resist coating apparatus installed in the coating and developing processing system shown in FIG. 1.
Figure 5:
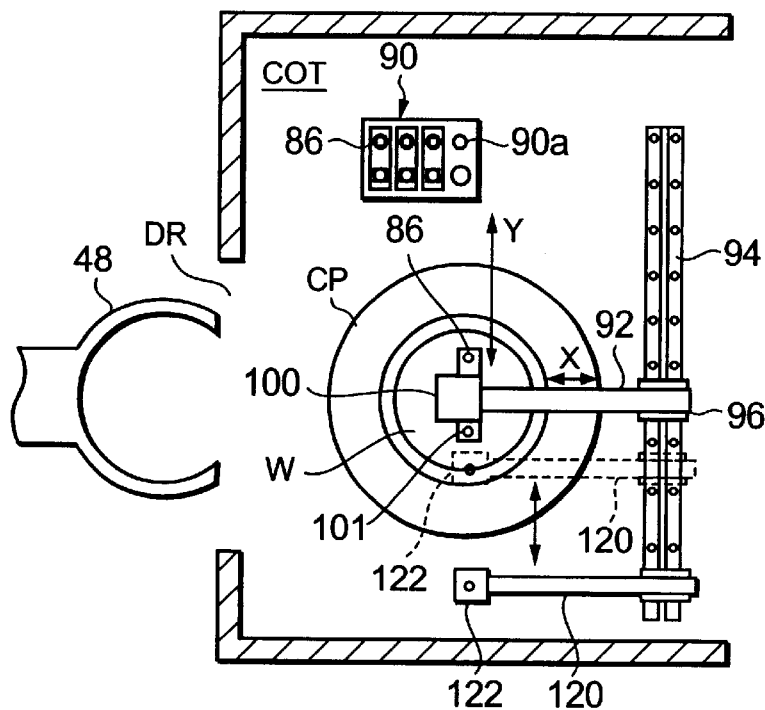
FIG. 5 is a plane view of the resist coating apparatus shown in FIG. 4.

Next, the resist coating unit (COT) is explained. FIG. 4 and FIG. 5 are a schematic sectional view and a schematic plane view respectively showing the whole structure of the resist coating unit (COT).

An annular cup CP is disposed in the central portion of the resist coating unit (COT), and a spin chuck 52 is disposed inside the cup CP. The spin chuck 52 is rotationally driven by a drive motor 54 while securely holding a wafer W by vacuum adherence. The drive motor 54 is disposed in an opening 50a provided in a unit bottom plate 50 to be ascendable and descendable, and is linked together with an ascent/descent drive means 60 composed of, for example, an air cylinder and an ascent/descent guide means 62 through a flange member 58 in cap form made of, for example, aluminum. On the side face of the drive motor 54, a cylindrical cooling jacket 64 made of, for example, SUS is attached, and the flange member 58 is attached in such a manner to cover the upper half of the cooling jacket 64.

When a resist is coated, a bottom end 58a of the flange member 58 contacts the unit bottom plate 50 in the vicinity of the outer periphery of the opening 50a, whereby the inside of the unit is sealed. When a wafer W is delivered between the spin chuck 52 and the holding member 48 of the main wafer transfer mechanism 22, the ascent/descent drive means 60 lifts the drive motor 54 or the spin chuck 52 upward, whereby the bottom end of the flange member 58 is ascended away from the unit bottom plate 50.

A resist solution supply nozzle 86 for supplying a resist solution onto the front face of the wafer W is joined to a resist solution supply section 89 via a resist supply pipe 88. The resist solution supply nozzle 86 is removably attached to the tip portion of a resist nozzle scan arm 92 via a nozzle holder 100. The resist nozzle scan arm 92 is attached to the top end portion of a vertical support member 96 which can horizontally move on guide rails 94 laid on the unit bottom plate 50 in one direction (the Y-direction), so that it moves in the Y-direction integrally with the vertical support member 96 by a Y-direction drive mechanism (not shown).

The resist solution supply nozzle 86 is so structured to discharge the resist solution once and thereafter to suck it back, thereby preventing dripping of the resist solution and drying of the resist solution.

Moreover, the resist nozzle scan arm 92 can move also in the X-direction orthogonal to the Y-direction to attach the resist solution supply nozzle 86 selectively thereto at a resist nozzle standby section 90, and hence it moves also in the X-direction by an X-direction drive mechanism not shown.

Furthermore, a discharge port of the resist solution supply nozzle 86 is inserted into an aperture 90a of a solvent atmosphere chamber at the resist nozzle standby section 90 to be exposed to the atmosphere of the solvent therein, so that a resist solution at the nozzle tip neither solidify nor deteriorate. Moreover, a plurality of resist solution supply nozzles 86 are provided and these nozzles are properly used, for instance, corresponding to the type of resist solution.

Attached to the tip portion (the nozzle holder 100) of the resist nozzle scan arm 92 is a solvent nozzle 101 for supplying a solvent, for example, a thinner for moistening the front face of the wafer onto the front face of the wafer in advance of the supply of the resist solution onto the front face of the wafer. The solvent nozzle 101 is joined to a solvent supply section with a solvent supply pipe not shown therebetween. The solvent nozzle 101 and the resist solution supply nozzle 86 are attached in such a manner that the respective discharge ports are positioned above a straight line along the Y-movement direction of the resist nozzle scan arm 92.

On the guide rails 94, provided is not only the vertical support member 96 for supporting the resist nozzle scan arm 92 but also a vertical support member 122 for supporting a rinse nozzle scan arm 120 and movable in the Y-direction. A rinse nozzle 124 for side rinse is attached to the tip portion of the rinse nozzle scan arm 120. The Y-direction drive mechanism (not shown) translates or linearly moves the rinse nozzle scan arm 120 and the rinse nozzle 124 between a rinse nozzle standby position (a position shown by the solid line) which is set beside the cup CP and a rinse solution discharge position (a position shown by the dotted line) which is set directly above the peripheral portion of the wafer W mounted on the spin chuck 52.

Moreover, directly above the wafer W, provided is a detecting sensor 105 for detecting a spreading state of an outline of the outer periphery of the resist solution when the resist solution is discharged onto almost the center of the rotated wafer W and the resist solution spreads out from almost the center of the wafer W toward the outer edge. As this detecting sensor 105, for example, a CCD camera can be used.

Figure 6:
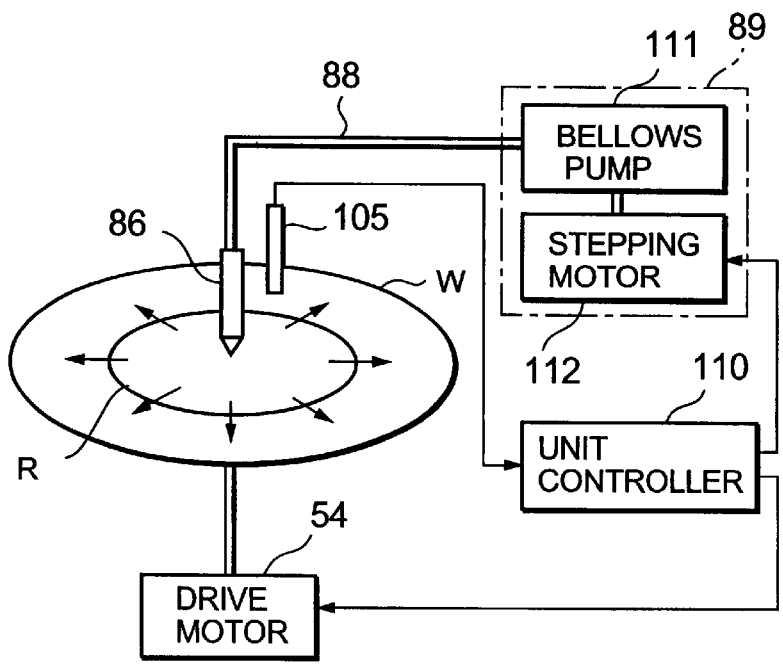
FIG. 6 is a schematic diagram showing a control system of a resist coating unit according to an embodiment of the present invention.

Next, a control system of the resist coating unit (COT) is explained with reference to FIG. 6. As shown in FIG. 6, the resist solution supply section 89 comprises a bellows pump 111 for supplying the resist solution, and a stepping motor 112 for driving the bellows pump. The stepping motor 112 and the drive motor 54 are connected with a unit controller 110. The detecting sensor 105 is also connected with the unit controller 110. A signal from the detecting sensor 105 is input to the unit controller 110, and the stepping motor 112 and the drive motor 54 are controlled by the unit controller 110 based on the signal. As the stepping motor 112, another motor which is controllable of position or speed may be employed.

Concretely, the unit controller 110 calculates a spreading speed of a resist solution R from information detected by the detecting sensor 105, and the rotation speed of the wafer W or the amount or the speed of the resist solution discharged from the resist solution supply nozzle 86 is controlled so that the spreading speed becomes not more than a predetermined speed with no danger of producing a scratchpad as described later.

In the resist coating unit (COT) structured as above, processing operations of applying the resist solution in a resist-saving mode which needs the amount of a resist solution consumed less than a conventional mode will be explained hereinafter.

First, when the wafer W is transferred to a position directly above the cup CP in the resist coating unit (COT) by the holding member 48 of the main wafer transfer mechanism 22, the wafer W is vacuum-sucked by the spin chuck 52 which has ascended by means of the ascent/descent drive means 60, for example, composed an air cylinder and the ascent/descent guide means 62. After the wafer W is vacuum-sucked by the spin chuck 52, the main wafer transfer mechanism 22 takes back the holding member 48 from inside the resist coating unit (COT), thereby completing deliver of the wafer W to the resist coating unit (COT).

Sequentially, the spin chuck 52 descends until the wafer W reaches a predetermined position in the cup CP, and then the rotational drive of the spin chuck 52 is started by the drive motor 54. Thereafter, the nozzle holder 100 is started to move from the resist nozzle standby section 90. The movement of the nozzle holder 100 is performed along the Y-direction.

When the discharge port of the solvent nozzle 101 reaches a position above the center of the spin chuck 52 (the center of the wafer W), the solvent, for example, a thinner is supplied onto the front face of the rotated wafer W. The solvent supplied onto the front face of the wafer W spreads out by centrifugal force from the center of the wafer W toward the whole surroundings thereof uniformly. The so-called pre-wet processing in which the whole front face of the wafer W is moistened with the solvent such as a thinner or the like is performed as above before application of a resist, whereby the resist comes to diffuse more easily resulting in a uniform resist film being formed with a smaller amount of the resist solution.

Then, the nozzle holder 100 is moved in the Y-direction until the discharge port of the resist solution supply nozzle 86 reaches a position above the center of the spin chuck 52 (the center of the wafer W), and the resist solution is dripped from the discharge port of the resist solution supply nozzle 86 onto the center of the front face of the rotated wafer W and then diffused from the center of the wafer W toward the surroundings by centrifugal force, whereby a resist film is formed on the wafer W.

When the resist solution R is dripped onto almost the center of the rotated wafer W, as shown in FIG. 6, the resist solution R diffuses from the center of the wafer W toward the surrounding portion by centrifugal force. During the above, the circular outline of the outer periphery of the resist solution R spreads out while the diameter thereof is increasing by centrifugal force.

In this embodiment, the spreading state of the outline of the outer periphery of the resist solution R is detected by the detecting sensor 105 such as a CCD camera or the like and the detected information is input to the unit controller 110. The unit controller 110 calculates the spreading speed of the outline of the outer periphery of the resist solution R from the detected information and discriminates whether or not the spreading speed of the outline is not more than a predetermined speed with no danger of producing a scratchpad. If the spreading speed of the outline exceeds the predetermined speed, a control signal is output from the unit controller 110 to, for example, the drive motor 54, and the speed of the rotation of the wafer W is decreased based on the control signal in the following coating processing, thereby decreasing the spreading speed of the outline of the resist solution R to prevent a scratchpad from occurring.

The scratchpad S can be prevented as described above, thereby preventing uncoating left on the wafer W, so that the resist solution can be applied uniformly in film thickness and additionally the amount of the resist solution R used can be reduced more than before. Through the control as above also in the case where "wettability" of the solvent such as a thinner or the like applied before the resist solution is poor, a scratchpad can be prevented from occurring.

To prevent a scratchpad, it is possible to control the amount or the speed of the resist solution R discharged in place of the control of the rotation speed of the wafer W. In this case, when the unit controller 110 discriminates that the spreading speed of the outline exceeds the predetermined speed, the stepping motor 112 for driving the bellows pump 111 is controlled by the unit controller 110 to control the amount or the speed of the resist solution R discharged, thereby preventing a scratchpad from occurring.

Moreover, to prevent a scratchpad, it is suitable to control both the rotation speed of the wafer W and the amount or the speed of the resist solution R discharged. In this case, when the unit controller 110 discriminates that the spreading speed of the outline exceeds the predetermined speed, both the drive motor 54 and the stepping motor 112 are controlled by the unit controller 110.

After the dripping of the resist solution is completed as above, the rotation speed of the wafer W is increased, whereby a remaining resist solution is blown off and the resist solution on the wafer W is dried, resulting in the formation of a resist film with a predetermined thickness.

Thereafter, the nozzle holder 100 is returned to the home position thereof. The back face of the wafer W undergoes a back rinse by means of a cleaning means not shown and the side peripheral portion of the wafer W undergoes a side rinse by means of a cleaning means not shown as required. Then, the rotation speed of the wafer W is increased, whereby the rinse solutions of the back rinse and the side rinse are blown off, and thereafter the rotation of the wafer W is stopped to complete the coating process.

Next, a resist coating unit (COT) according to another embodiment of the present invention will be described with reference to FIG. 7 and FIG. 8.

Figure 7:
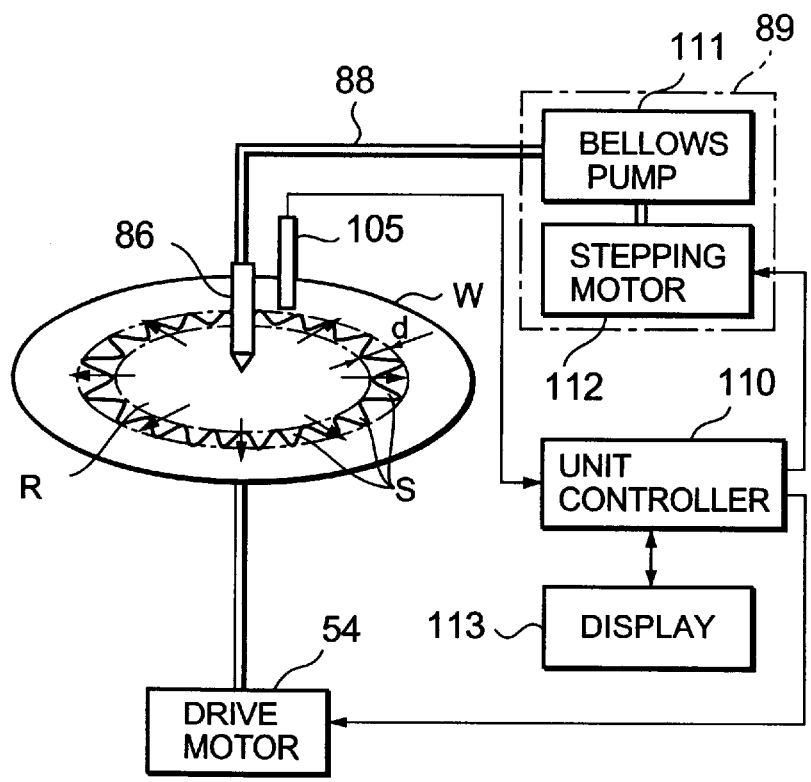
FIG. 7 is a schematic diagram showing a control system of a resist coating unit according to another embodiment of the present invention.
Figure 8:
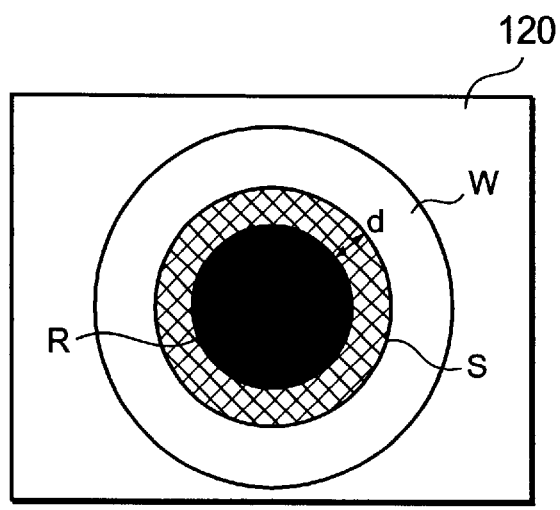
FIG. 8 is a diagrammatic illustration of a state of a resist solution on a wafer monitored by a display device installed in the resist coating unit shown in FIG. 7.

As shown in FIG. 7, a control system of the resist coating unit (COT) of this embodiment is the same as FIG. 6. A stepping motor 112 for driving a bellows pump 111 of a resist solution supply section 89 and a drive motor 54 are connected to a unit controller 110. A detecting sensor 105 is also connected to the unit controller 110. A signal from the detecting sensor 105 is input to the unit controller 110, and the stepping motor 112 and the drive motor 54 are controlled by the unit controller 110 based on the signal.

Concretely, when a scratchpad S is detected by the detecting sensor 105, the unit controller 110 measures a width d in the direction of the radius of the scratchpad S from the detected information, and the rotation speed of the wafer W or the amount or the speed of the resist solution discharged from the resist solution supply nozzle 86 is controlled so that the width of the scratchpad S becomes not so large as to exert influence upon application of the resist solution as described later.

A display device 113 is connected to the unit controller 110 to monitor a state during the above. On the display device 113, as shown in FIG. 8, when the wafer W is rotated, a portion of the resist solution R is displayed in the form of a black circle, in contrast to which a portion of the scratchpad S is displayed in a gray ring-shaped belt and the width of the gray ring-shaped belt is the width d in the direction of the radius of the scratchpad S.

In the resist coating unit (COT) of this embodiment structured as above, processing operations of applying the resist solution in a resist-saving mode which needs the amount of a resist solution consumed less than a conventional mode will be explained hereinafter.

First, after the wafer W is delivered to the resist coating unit (COT) in the same way as in the aforesaid embodiment, the spin chuck 52 descends until the wafer W reaches a predetermined position in the cup CP, and the rotational drive of the spin chuck 52 is started by the drive motor 54. Thereafter, the pre-wet processing is performed as in the aforesaid embodiment and sequentially the resist solution is dripped from the resist solution supply nozzle 86 onto the center of the front face of the rotated wafer W and then diffused from the center of the wafer W toward the surroundings by centrifugal force, whereby a resist film is formed on the wafer W.

When the resist solution R is dripped onto almost the center of the rotating wafer W and the resist solution R is diffused from the center of the wafer W toward the surrounding portion by centrifugal force, the circular outline of the outer periphery of the resist solution R spreads out while the diameter thereof is increasing by centrifugal force. If the spreading speed of the outline exceeds a predetermined speed, the outline is broken resulting in occurrence of a scratchpad.

During the above, the spreading state of the outline of the resist solution is detected by the detecting sensor 105 such as a CCD camera or the like, the state is sent to the unit controller 110, and the state at that time is monitored by the display device 113. If the scratchpad S is detected by the detecting sensor 105, the width d of the scratchpad S is measured by the unit controller 110. At this time, as shown in FIG. 8, the whole image of the wafer W is displayed on the display device 113 and the scratchpad S is displayed in a gray ring-shaped belt when the wafer W is rotated, and thus the width d in the direction of the radius of the scratchpad S can be read by the display device 113.

The unit controller 110 discriminates whether or not the measured width d in the radius direction is not more than a predetermined value. If the width d exceeds the predetermined value, a control signal is output from the unit controller 110 to, for example, the drive motor 54, and the speed of the rotation of the wafer W is decreased based on the control signal in the following coating processing, thereby decreasing the spreading speed of the outline of the resist solution R, so that the width d of the scratchpad S has a value at a level so as not to exert influence upon application of the resist solution R.

As described above, the width d of the scratchpad S is controlled to become a value at a level so as not to exert influence upon application of the resist solution R, thereby preventing uncoating left on the wafer W, so that the resist solution can be applied uniformly in film thickness and additionally the amount of the resist solution R used can be reduced further. Also in the case where "wettability" of the solvent such as a thinner or the like applied before the resist solution is poor, the resist solution can be applied without occurrence of uncoating.

Also in this embodiment, it is possible to control the amount or the speed of the resist solution R discharged in place of the control of the rotation speed of the wafer W, and further it is suitable to control both the rotation speed of the wafer W and the amount or the speed of the resist solution R discharged.

After the dripping of the resist solution is completed as above, a remaining solution is blown off and the resist solution on the wafer is dried as in the aforesaid embodiment, resulting in the formation of a resist film with a predetermined thickness. Sequentially, the wafer W undergoes a back rinse and undergoes a side rinse as required, and further the rinse solutions are blown off, and thereafter the rotation of the wafer W is stopped to complete the coating process.

Next, still another embodiment of the present invention will be described.

Figure 9:
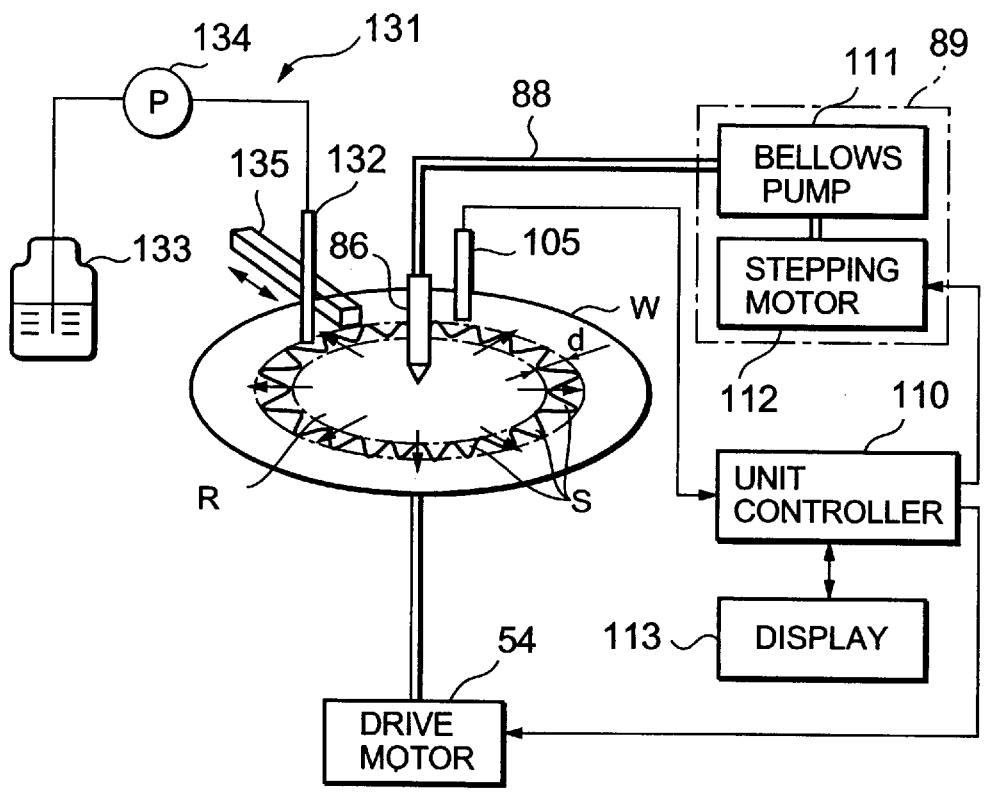
FIG. 9 is a schematic diagram showing a control system of a resist coating unit according to still another embodiment of the present invention.

As shown in FIG. 9, a control system of the resist coating unit (COT) of this embodiment is the same as in the aforesaid embodiment. A stepping motor 112 for driving a bellows pump 111 of a resist solution supply section 89 and a drive motor 54 are connected to a unit controller 110. A detecting sensor 105 is also connected to the unit controller 110. Addition to the above, this embodiment has a thinner supply section 131 for supplying a thinner to the outer regions of the outline of the outer periphery of the resist diffusing on the wafer W. The thinner supply section 131 includes a thinner discharge nozzle 132 disposed above the wafer W, a thinner storage portion 133 in which a thinner is stored, a pump 134 for sending the thinner stored in the thinner storage portion 133 to the thinner discharge nozzle 132, a drive portion 135 for driving the thinner discharge nozzle 132 in the direction of the radius of the wafer W. A signal from the detecting sensor 105 is input to the unit controller 110, and the stepping motor 112, the drive motor 54, the pump 134, and the drive portion 135 are controlled by the unit controller 110 based on the signal.

Figure 10:
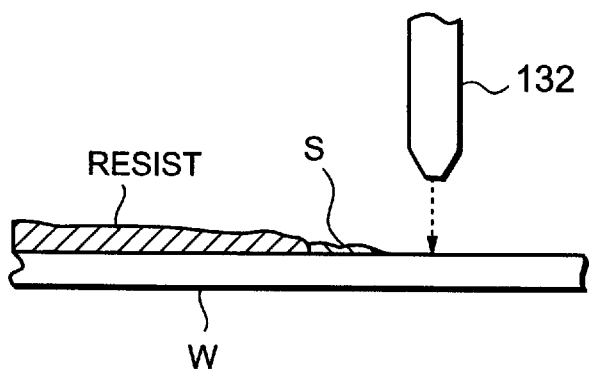
FIG. 10 is a diagrammatic illustration showing a state of a thinner supply nozzle above a wafer in the resist coating unit shown in FIG. 9.

Concretely, in the same way as in the aforesaid embodiment, when a scratchpad S is detected by the detecting sensor 105, the unit controller 110 measures a width d in the direction of the radius of the scratchpad S based on the detected information, and the rotation speed of the wafer W, or the amount or the speed of the resist solution discharged from the resist solution supply nozzle 86 is controlled so that the width of the scratchpad S becomes not so large as to exert influence upon application of the resist solution as described later. In addition to the above in this embodiment, as shown in FIG. 10, for instance when the width of the scratchpad S becomes not less than a predetermined width, the thinner is supplied from the thinner discharge nozzle 132 onto the wafer W, to the outer regions of the outline of the outer periphery of the resist solution diffusing on the wafer W, so that the width of the scratchpad S becomes not so large as to exert influence upon application of the resist solution.

According to this embodiment, a bad influence of the scratchpad S can be avoided more effectively by the supply of the thinner in addition to the aforesaid embodiment.

It should be noted that though the thinner is supplied from the thinner discharge nozzle 132 onto the wafer W in the above embodiment, a thinner atmosphere may be supplied onto the wafer W in place of the thinner.

Next, yet another embodiment of the present invention will be described.

Figure 11:
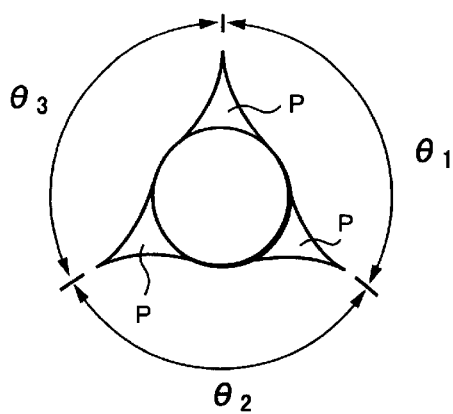
FIG. 11 is a diagrammatic illustration showing a state of a resist solution on a wafer in a resist coating unit according to yet another embodiment.
Figure 12:
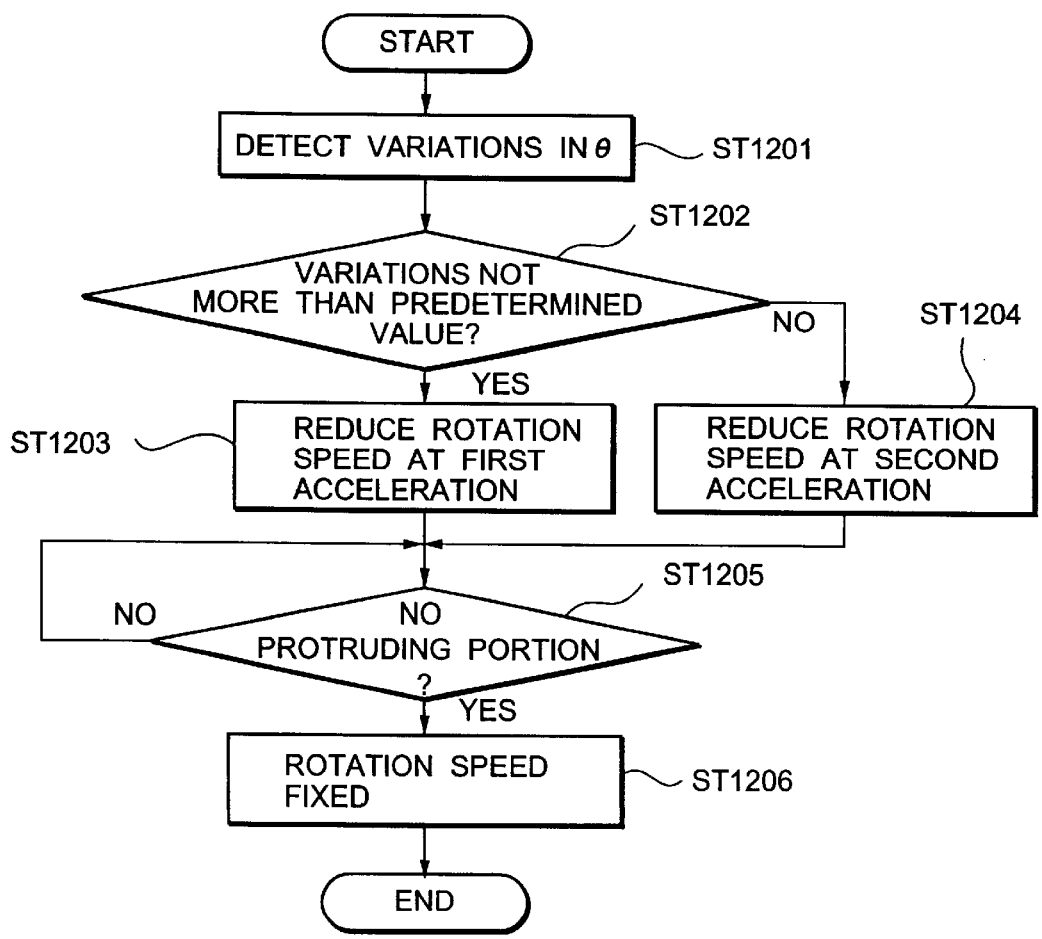
FIG. 12 is a flowchart showing processing descriptions in a resist coating unit according to further still another embodiment.
Figure 13:
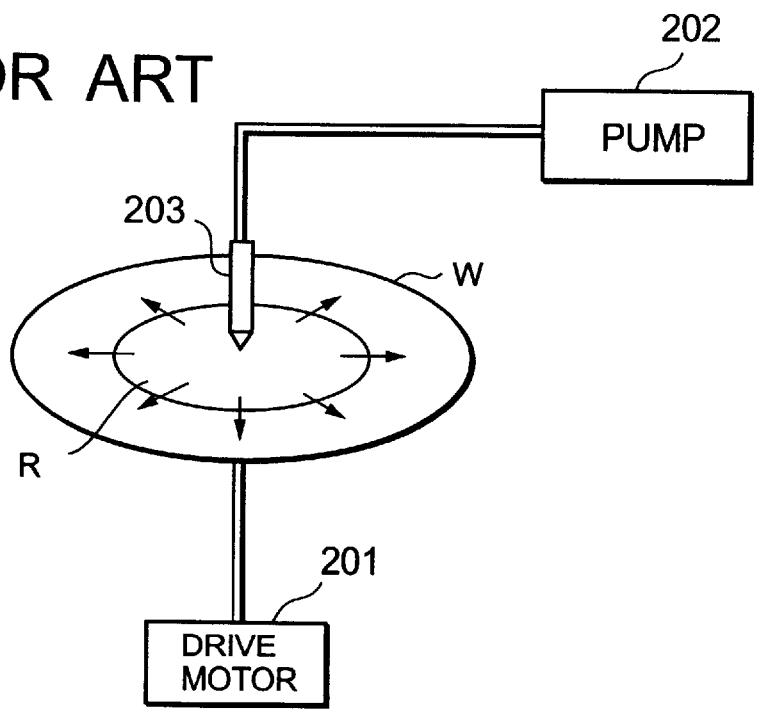
FIG. 13 is a schematic diagram showing a resist coating unit according to the prior art.
Figure 14:
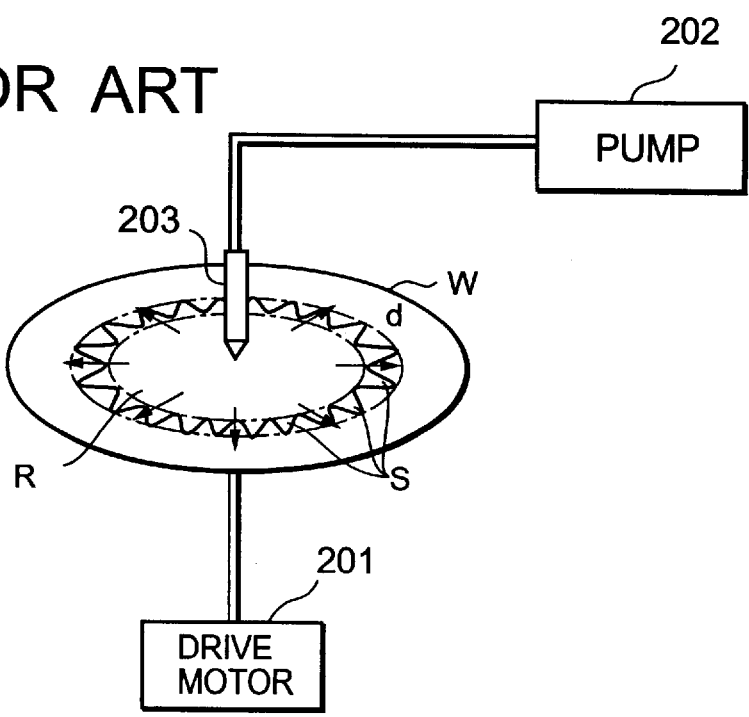
FIG. 14 is a schematic diagram showing a state where a scratchpad is produced in the resist coating unit shown in FIG. 13.

A control system of the resist coating unit (COT) of this embodiment is the same as that shown in FIG. 7. In the resist coating unit (COT) of this embodiment, when detecting the scratchpad S through the detecting sensor 105, the unit controller 110 detects variations in a plurality of angle θ1 to angle θ3 formed between a plurality of protruding portions P which protrude from a scratchpad S formed by breaking the outline of the outer periphery of the resist solution diffusing on the wafer W as shown in FIG. 11 (STEP 1201 in FIG. 12). It is possible that if the amount of protrusion of a protruding portion out of the protruding portions P is not more than a predetermined amount, the protruding portion is eliminated from the plurality of protruding portions P so as not to be regarded as a protruding portion.

Next, if the detected variations are not more than a predetermined value (STEP 1202), the rotation speed of the wafer W is reduced at a first acceleration (−a) (STEP 1203), and if the variations are not less than the predetermined value (STEP 1202), the variations are displayed on the display device 113 and the rotation speed of the wafer W is reduced at a second acceleration (−b) which is larger than the first acceleration (−a) (STEP 1204). Incidentally, not by a display on the display device 113, but another reporting method such as an alarm sound or the like is also applicable.

When the protruding portions P have disappeared after the above reduction in speed (STEP 1205), that is, when the scratchpad formed by breaking the outline of the outer periphery of the resist solution has come into almost a circle, the reduction in speed is stopped to keep the rotation speed of the wafer W at a fixed speed (STEP 1206).

If variations in a plurality of angle θ1 to angle θ3 formed between a plurality of protruding portions P which protrude from a scratchpad S are not less than the predetermined value, the position of the resist solution supply nozzle 86 or the position of the wafer W on the spin chuck is displaced, and thus maintenance thereof is in great need. Accordingly, the report is done in the above case as in this embodiment, so that a defect such as variations in film thickness due to, for example, the aforesaid positional displacement can be prevented from sequentially occurring by performing the maintenance for the following wafers W. Moreover, in this embodiment, especially in the case where variations are not less than the predetermined value, the rotation speed of the water W is reduced at the second acceleration (−b) which is larger than usual, whereby force is exerted on the resist solution spreading out on the wafer W in the direction opposite to the direction of rotation of the wafer W, so that extension of the protruding portions P in the direction of the normal is stopped. In this case, since the rate of the reduction in speed is high, the already-existing protruding portions P and newly appearing protruding portions P extend in the tangential direction to become almost a circle. Thereby, a defect such as variations in film thickness due to the aforesaid positional displacement can be prevented also in this wafer W itself.

Also in this embodiment, the supply of the thinner or the supply of the thinner atmosphere may be performed to the outer regions of the outline as in the aforesaid embodiments.

The present invention is not limited to the aforesaid embodiments, and various modifications can be made. For instance, the example in which the resist solution is used as the coating solution has been explained in the aforesaid embodiments, and the present invention can also be applied to the case where another coating solution such as a polyimide or the like is used. Further, the case where the semiconductor wafer is used as the object to be processed has been shown in the aforesaid embodiments, not only to this, but the present invention is applicable to formation of a coating film for another substrate such as an LCD substrate or the like.

As has been described, according to the present invention, the spreading state of the outline of the outer periphery of the coating solution diffusing from almost the center of the rotated substrate toward the outer edge is detected, the spreading speed is calculated from the spreading state, and the rotation speed of the substrate and/or the amount or the speed of the coating solution discharged from the coating solution supply nozzle are/is controlled so that the spreading speed becomes not more than a predetermined speed, thereby preventing a scratchpad, as a result, uncoating on the substrate can be prevented and the coating solution can be applied uniformly in film thickness.

Moreover, the spreading state of the outline of the outer periphery of the coating solution diffusing from almost the center of the rotated substrate toward the outer edge is detected, the spreading state of the outline of the outer periphery of the coating solution is detected when the coating solution is diffused from almost the center of the rotated substrate toward the outer edge, and when a scratchpad formed by breaking the outline of the outer periphery of the coating solution is detected, the width in the radius direction of the scratchpad is kept, and the rotation speed of the substrate and/or the amount or the speed of the coating solution discharged from the coating solution supply nozzle are/is controlled so that the above width becomes not more than a predetermined value. Thereby, the scratchpad can be prevented from becoming so large as to exert influence upon application of the resist solution, so that uncoating on the substrate can be prevented and the coating solution can be applied uniformly in film thickness.

Consequently, according to the present invention, it is unnecessary to supply an excessive coating solution unlike the prior art, the amount of the coating solution used can be reduced further, and even if wettability of the solvent applied before the coating solution is poor, occurrence of uncoating of the coating solution can be prevented.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A coating apparatus, comprising:
    means for rotating a substrate;
    means for discharging a coating solution onto a center area of the rotated substrate;
    detecting means for detecting a spreading state of an outline of an outer periphery of the coating solution, said outline formed by the coating solution when the discharged coating solution diffuses from the center area of the rotated substrate toward an outer edge of the rotated substrate; and
    means for controlling at least one of substrate rotation speed, discharged amount of coating solution, and coating solution discharge rate based on the detected spreading state.

2. The apparatus as set forth in claim 1,
    wherein said controlling means calculates a spreading speed from the spreading state of the outline, and controls at least one of the substrate rotation speed, the discharged amount of coating solution, and the coating solution discharge rate so that the spreading speed becomes not more than a predetermined speed.

3. The apparatus as set forth in claim 2,
    wherein when an irregular waveform formed by breaking the outline of the outer periphery of the coating solution is detected, said controlling means maintains a width in the direction of the radius of the irregular waveform and controls at least one of the substrate rotation speed, the discharged amount of coating solution, and the discharge rate of the coating solution so that the width becomes not more than a predetermined value.

4. The apparatus as set forth in claim 2,
    wherein when an irregular waveform formed by breaking the outline of the outer periphery of the coating solution is detected, said controlling means maintains a width in the direction of a radius of the irregular waveform and performs at least one of reduction in the substrate rotation speed, increase in the discharge amount of the coating solution, and increase in the coating solution discharge rate if the width exceeds a predetermined value.

5. The apparatus as set forth in claim 2, wherein said outline has an outer region, further comprising:

means for performing at least one of supply of a thinner onto the outer region of the outline and supply of an atmosphere including thinner onto the outer region of the outline based on the detected state.

6. A coating apparatus, comprising:

means for rotating a substrate;

means for discharging a coating solution onto a center area of the rotated substrate;

detecting means for detecting a spreading state of an outline of an outer periphery of the coating solution when the discharged coating solution is diffused from the center area of the rotated substrate toward an outer edge of the rotated substrate, said outline having an outer region; and means for performing at least one of supply of a thinner onto the outer region of the outline and supply of an atmosphere including thinner onto the outer region of the outline based on the detected spreading state.

7. A coating apparatus, comprising:

means for rotating a substrate at a rotation speed;

means for discharging a coating solution onto substantially the center of the rotated substrate; and means for detecting variations in a plurality of angles formed between a plurality of protruding portions which protrude from an irregular waveform formed by breaking an outline of an outer periphery of the discharged coating solution.

8. The apparatus as set forth in claim 7, wherein when said means for detecting variations detects a protruding portion that protrudes out of the protruding portions is not greater than a predetermined amount, said detecting means eliminates the protruding portion from the plurality of protruding portions by altering operation of the coating apparatus.

9. The apparatus as set forth in claim 7, further comprising:

means for reducing the rotation speed of the substrate in response to the means for detecting variations by a first acceleration when the detected variations are not greater than a first predetermined value, and when the variations are not less than a second predetermined value.

10. The apparatus as set forth in claim 9, further comprising:

means for reducing the rotation speed of the substrate by a second acceleration which is larger than the first acceleration when the variations are not less than the second predetermined value.

11. The apparatus as set forth in claim 9, further comprising:

means for stopping the reduction in speed that is capable of ceasing operation of the rotation speed reduction means when the protruding portions disappear after the reduction in speed.

12. The apparatus as set forth in claim 7, wherein said outline has an outer region, further comprising:

means for performing at least one of supply of a thinner onto the outer region of the outline and supply of an atmosphere including thinner onto the outer region of the outline when the protruding portions are detected.

* * * * *